United States Patent
Pistoia et al.

(10) Patent No.: US 11,507,397 B2
(45) Date of Patent: Nov. 22, 2022

(54) SYSTEMS AND METHODS FOR ZERO-FOOTPRINT AND SAFE EXECUTION OF QUANTUM COMPUTING PROGRAMS

(71) Applicant: JPMORGAN CHASE BANK, N.A., New York, NY (US)

(72) Inventors: Marco Pistoia, Amawalk, NY (US); Robert Matles, Glenview, IL (US); Matthew Liste, New York, NY (US); David A. Carter, New York, NY (US); Apoorv Saxena, New York, NY (US); Alexander Buts, New York, NY (US); Dylan Herman, New York, NY (US)

(73) Assignee: JPMORGAN CHASE BANK, N.A., New York, NY (US)

( * ) Notice: Subject to any disclaimer, the term of this patent is extended or adjusted under 35 U.S.C. 154(b) by 83 days.

(21) Appl. No.: 17/089,897

(22) Filed: Nov. 5, 2020

(65) Prior Publication Data
US 2022/0137989 A1    May 5, 2022

(51) Int. Cl.
| G06F 9/54 | (2006.01) |
| G06F 9/451 | (2018.01) |
| G06F 30/20 | (2020.01) |
| G06N 10/00 | (2022.01) |

(52) U.S. Cl.
CPC .............. *G06F 9/451* (2018.02); *G06F 30/20* (2020.01); *G06N 10/00* (2019.01)

(58) Field of Classification Search
CPC .... G06F 9/4443; G06F 9/45512; G06F 9/465; G06F 9/547; G06F 9/548
USPC .................................................. 719/320, 330
See application file for complete search history.

(56) References Cited

U.S. PATENT DOCUMENTS

| 10,803,395 | B2 * | 10/2020 | Pistoia | G06F 8/35 |
| 11,194,573 | B1 * | 12/2021 | Smith | G06F 8/41 |
| 11,270,220 | B1 * | 3/2022 | Richardson | G06N 10/00 |
| 2020/0117764 | A1 * | 4/2020 | Zuccarelli | G06F 30/20 |

* cited by examiner

*Primary Examiner* — Andy Ho
(74) *Attorney, Agent, or Firm* — Greenberg Traurig LLP

(57) ABSTRACT

Systems and methods for zero-footprint and safe execution of quantum computing programs are disclosed. According to one embodiment, in an electronic device comprising at least one computer processor, a method for cloud-based execution of quantum-computing programs may include: (1) receiving, from a user interface on a client device, a serialized file comprising a domain, an application, and an algorithm; (2) receiving, from the user interface, problem data and an identification of a quantum computing backend for executing the problem data; (3) instantiating a quantum program for execution and communicating the quantum program and the problem data to the quantum computing backend for execution; (4) receiving, from the quantum computing backend, an output of the execution; and (5) communicating the output to the user interface on the client device.

16 Claims, 2 Drawing Sheets

SYSTEMS AND METHODS FOR ZERO-FOOTPRINT AND SAFE EXECUTION OF QUANTUM COMPUTING PROGRAMS

FIELD OF THE INVENTION

The present disclosure relates generally to systems and methods for zero-footprint and safe execution of quantum computing programs.

DESCRIPTION OF THE RELATED ART

Quantum computing promises the ability to solve problems that classical computing cannot. This may lead to breakthroughs in science, materials, financial strategies, etc.

SUMMARY OF THE INVENTION

Systems and methods for zero-footprint and safe execution of quantum computing programs are disclosed. According to one embodiment, in an electronic device comprising at least one computer processor, a method for cloud-based execution of quantum-computing programs may include: (1) receiving, from a user interface on a client device, a serialized file comprising a domain, an application, and an algorithm; (2) receiving, from the user interface, problem data and an identification of a quantum computing backend for executing the problem data; (3) instantiating a quantum program for execution and communicating the quantum program and the problem data to the quantum computing backend for execution; (4) receiving, from the quantum computing backend, an output of the execution; and (5) communicating the output to the user interface on the client device.

In one embodiment, the domain, the application, and the algorithm may be selected serially.

In one embodiment, the serialized file may have a standardized format.

In one embodiment, the domain, the application, and the algorithm may be represented in the serialized file as key/value pairs.

In one embodiment, the quantum computing backend may include a quantum computer, a quantum computing simulator, etc.

In one embodiment, the client device may check the domain, the application, and the algorithm for consistency.

According to another embodiment, in an electronic device comprising at least one computer processor, a method for cloud-based execution of quantum-computing programs may include: (1) receiving, from a user interface on a client device, a selection of a domain, an application, and an algorithm; (2) receiving, from the user interface, problem data and an identification of a quantum computing backend for executing the problem data; (3) serializing the selection of the domain, the application, and the algorithm; (4) communicating the serialized file and the problem data to a server, wherein the server instantiates a quantum program for execution and communicates the quantum program and the problem data to the quantum computing backend for execution; (5) receiving, from the quantum computing backend via the server, an output of the execution; and (6) presenting the output to the user interface on the client device.

In one embodiment, the domain, the application, and the algorithm may be selected serially.

In one embodiment, the serialized file may have a standardized format.

In one embodiment, the domain, the application, and the algorithm may be represented in the serialized file as key/value pairs.

In one embodiment, the quantum computing backend may include a quantum computer, a quantum computing simulator, etc.

In one embodiment, the method may further include checking the domain, the application, and the algorithm for consistency.

According to another embodiment, a system for cloud-based execution of quantum-computing programs may include a client device comprising a client device computer processor and executing a user interface; a server comprising a server computer processor in communication with the client device; a domain library comprising a plurality of domains; an application library comprising a plurality of applications; an algorithm library comprising a plurality of algorithms; a circuit library comprising a plurality of quantum circuits; and a plurality of quantum computing backends. The client device may receive, at the user interface a selection of a domain from the plurality of domains in the domain library, an application from the plurality of applications in the application library, and an algorithm from the plurality of algorithms in the algorithm library; may receive, at the user interface problem data and an identification of one of the quantum computing backends for executing the problem data; may serialize the selection of the domain, the application, and the algorithm; may communicate the serialized file and the problem data to a server, wherein the server instantiates a quantum program for execution and communicates the quantum program and the problem data to the quantum computing backend for execution, wherein the quantum program may include at least one circuit from the circuit library; may instantiate a quantum program for execution and communicates the quantum program and the problem data to the quantum computing backend for execution; and may receive, from the quantum computing backend, an output of the execution communicates the output to the user interface on the client device.

In one embodiment, the domain, the application, and the algorithm may be selected serially.

In one embodiment, the domain, the application, and the algorithm may be represented in the serialized file as key/value pairs.

In one embodiment, the plurality of quantum computing backends may include a quantum computer and a quantum computing simulator.

In one embodiment, the client device may check the domain, the application, and the algorithm for consistency.

BRIEF DESCRIPTION OF THE DRAWINGS

In order to facilitate a fuller understanding of the present invention, reference is now made to the attached drawings. The drawings should not be construed as limiting the present invention but are intended only to illustrate different aspects and embodiments.

DETAILED DESCRIPTION

Embodiments relate generally to systems and methods for zero-footprint and safe execution of quantum computing programs.

As with classical computing, many end users will not care how their problem is solved; they only care that the problem is solved, ideally in real time and with accurate results. And, because quantum computing is very different from classical computing, most users will not know or be able to provide quantum instructions to the computer. Thus, embodiments are directed to systems and methods for cloud-based execution of quantum-computing programs.

In embodiments, users may configure a quantum-computing program locally, for example, on a web browser, with instructions for that program to be executed on a remote cloud-based system. The risk behind such approach is that remote users, perhaps inadvertently, could submit to the remote system code capable of affecting the integrity or violating the confidentiality of the data on the remote system. Therefore, embodiments are directed to systems and methods that allow only verified code to be executed, whereas harmful code will be prevented from being uploaded and executed.

Embodiments may provide at least some of the following technical advantages: extensibility (e.g., plug-and-play new domains, applications, algorithms, algorithmic components, and devices); modularity (e.g., support for reusable components, enablement for focused research in specific areas only); support for multiple user types (e.g., financial analysts, quantum researchers, programmers, non-programmers); multiple interfaces (e.g., programmatic, declarative, visual and Web; Web interface requires no installation); configuration-error resilience (e.g., run-time schema-based quantum/application configuration validation); ease of use (e.g., user interface allows for: (a) configuring and running an experiment, and (b) automatic code extraction); hardware independence (e.g., the same experiment may be run on multiple devices and simulators for easy comparison); scientific value (e.g., will contain the most competitive collection of unique quantum algorithms for these domains); run-time-environment protection (e.g., harmful code is prevented from being uploaded and executed).

Figure 1:
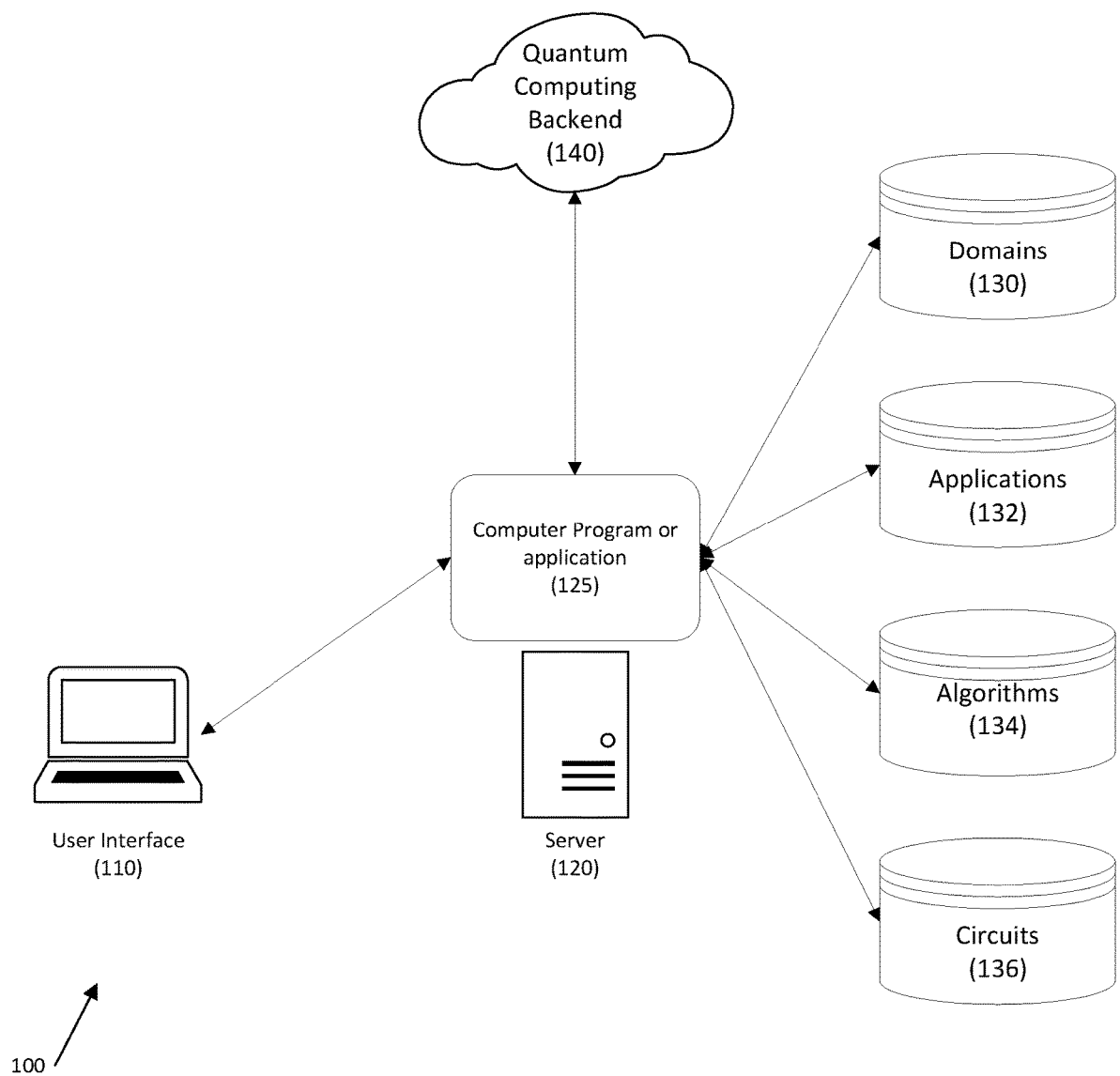
FIG. 1 depicts a system for cloud-based execution of quantum-computing programs according to one embodiment.

Referring to FIG. 1, a system for cloud-based execution of quantum-computing programs is disclosed according to one embodiment. System 100 may include user interface 110 that may be any suitable electronic device (e.g., computers, workstations, terminals, smartphones, kiosks, Internet of Things (IoT) devices, etc.). User interface 110 may interface with computer program or application 125 that may be executed by server 120, which may be a physical server, a hardware server, etc.

Computer program or application 125 may interface with one or more library, including domains library 130, applications library 132, algorithms library 134, and circuits library 136. Other libraries may be provided depending on the end use, or as otherwise necessary and/or desired.

Example domains may include finance, optimization, artificial intelligence, etc. Other domains may be included as is necessary and/or desired. Examples of finance applications may include risk analysis, portfolio optimization, portfolio diversification, etc. Examples of optimization applications may include the "traveling salesman" problem, maximum cut, clique, stable set, graph partition, etc. Examples of artificial intelligence applications may include support vector machines, neural networks, reinforcement learning, etc.

Examples of algorithms may include quantum algorithms (e.g., Grover, Shor, Phase Estimation, Amplitude Estimation, etc.); quantum/classical hybrid algorithms (e.g., Variational Quantum Eigensolver, Quantum Approximate Optimization Algorithm, etc.); algorithmic components (e.g., Variational Forms, Optimizers, Feature Maps, Multiclass Classification Extensions, Uncertainty Problems, Quantum Fourier Transforms, etc.); and classical algorithms (e.g., Classical Eigensolver, Linear System Solver, Support Vector Classifier with Radial Basis Function Kernel, etc.). Other algorithms may be used as is necessary and/or desired.

Examples of circuits include hardware-independent quantum circuit management, such as circuit generation, compilation, hardware-specific translation, hardware specific optimization, etc. In one embodiment, the circuits library 136 may include circuit basic blocks to generate circuits programmatically, on the fly, depending on the problem being solved.

Although four libraries 130, 132, 134, and 136 are depicted, it should be recognized that a greater number of libraries, or a fewer number of libraries, may be provided. For example, domains library 130 and applications library 132 may be merged into the same library.

Computer program or application may further interface with quantum computing backend 140, which may include quantum computing cloud-based resources, including, for example, quantum computers, quantum computer simulators, combinations thereof, etc. The configuration may be arbitrarily complex and include low-level parameters, such as the use of individual qubits in the quantum computer or simulator used for the execution.

In one embodiment, quantum computing backend 140 may be a cloud-based resource.

An example of a quantum computing simulator is disclosed in U.S. Provisional Patent Application Ser. No. 62/978,252, the disclosure of which is hereby incorporated, by reference, in its entirety.

Although only one quantum computing backend 140 is depicted in FIG. 1, it should be recognized that additional quantum computing backends 140 may be used as is necessary and/or desired.

In one embodiment, using computer program or application 125 via user interface 110, a user may select one or more of a domain from domains library 130, an application from applications library 132, and an algorithm or combination of algorithms from algorithms library 134.

The algorithm, or combination of algorithms, may generate one or more circuits via calls to circuits library 136. The circuit or circuits generated via calls to circuits library 136 may then be executed on a quantum computer server 120, which produces the output of the program. Such output is communicated back to the user via the user interface 110 chosen by the user to communicate with the system.

At the point in which the user configures a quantum program execution via user interface 110, the user interface may be configured to produce a summary of the program-execution configuration, including the input to the program, the algorithm to be used, and the parameters to the classical and/or quantum components used to execute the experiment. In one embodiment, this summary may be produced and saved as a JSON file. Such summary file may be transferred to the server on the cloud for instantiating the program execution. With this approach, there is no need for the client side of the program to have any of the server-side libraries installed, as all those libraries are used on the server side.

User interface 110 may also be augmented with parameter-checking capabilities. For example, user interface 110 may control that the parameters are of the types and within expected ranges, and that the software components chosen by the user to solve the problem of interest are used consistently with each other. For example, the Variational Quantum Eigensolver (VQE) algorithm requires the use of a classical optimizer. The user will therefore be prompted with the choice of a classical optimizer to be used during the execution of VQE, assuming that VQE is the algorithm selected by the user to solve the particular problem of interest. If, however, the user selects Phase Estimation as the algorithm of choice, there is no need for a classical optimizer and such choice can be disabled or otherwise flagged as an error if the user chooses a classical optimizer.

In addition to error detection, embodiments may verify statically that the program configuration entered by the user is "safe," in the sense that it will not harm the integrity of the computer on which the program will be executed. In embodiments, no executable code is uploaded to the server, thereby preventing code-injection attacks. The only code may be uploaded is declarative configuration code.

In another embodiment, user interface 110 may be a programmatic user interface, such as a Jupyter Notebook interface. This solution is also a zero-footprint solution because the code dependencies may be automatically pre-configured without the user having to install any library beforehand.

Figure 2:
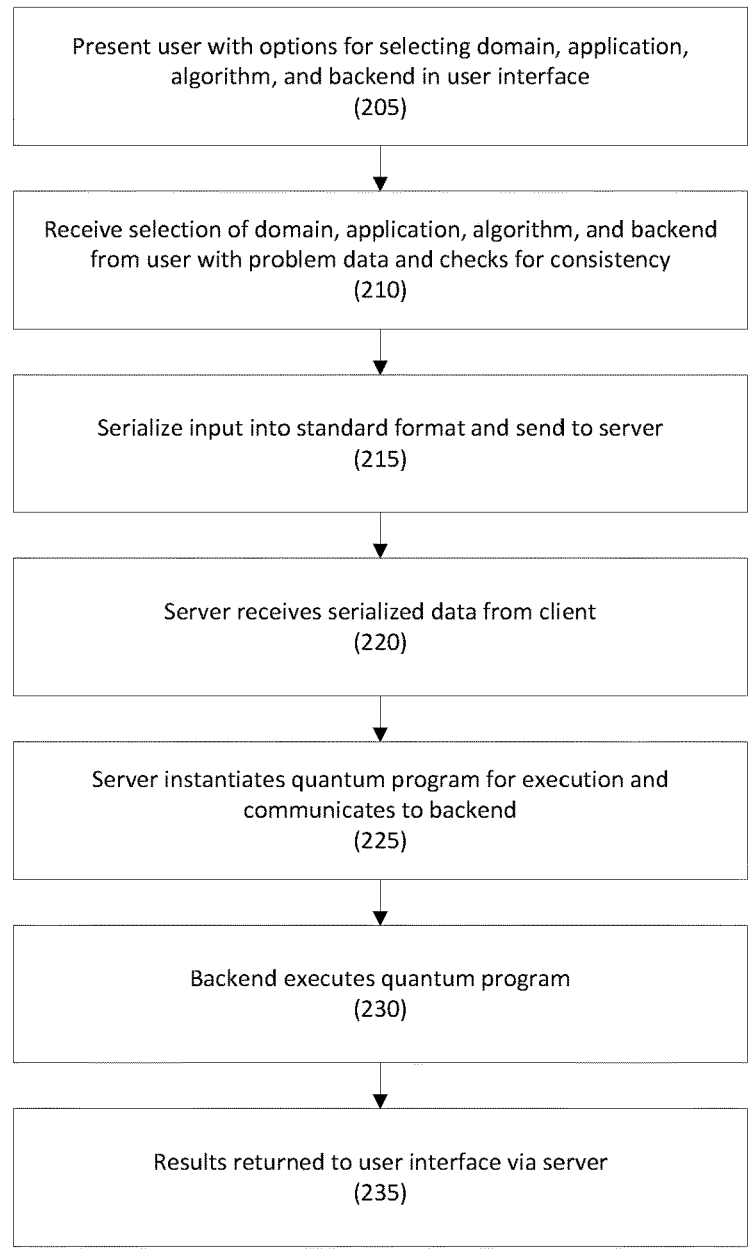
FIG. 2 depicts a method for cloud-based execution of quantum-computing programs according to one embodiment.

Referring to FIG. 2, a method for cloud-based quantum execution is disclosed according to one embodiment. In embodiments, a user may execute a quantum application by interacting directly only with the user interface. The application configuration is uploaded to the server, where the program execution is instantiated according to the directions of the user, after having statically verified that the program-execution configuration is safe. On the server side, the input to the program specified by the user is translated into an input to a quantum algorithm or combination of algorithms, whose goal is to generate one or more circuits. Such circuits will then be executed on a quantum computing backend, such as a quantum computing computer or a quantum computing simulator, and the output of that execution will be presented back to the user via the user interface.

In step 205, a user may be presented with options for quantum execution by the quantum resources. For example, the user may be presented with a menu of domains, applications, algorithms, algorithmic components, quantum computing backends, and other parameters as is necessary and/or desired. In one embodiment, the menu may provide sub-options based on a prior selection. For example, once the user selects a domain, the user may be presented with a menu of applications that are appropriate for the domain. Similarly, once the user selects an algorithm, the user may be presented with a menu of algorithmic components that are appropriate for that algorithm. Any suitable manner of making selections may be used as is necessary and/or desired.

In step 210, the user's selections may be received, and in step 215, the user's input may be serialized into a first file having a standard format. For example, the first file may be a dictionary file and may be in the JSON format.

In one embodiment, the serialized data may be represented in the form of a dictionary. Each key/value pair in the dictionary corresponds to a selection made by the user. For example, key "domain" may be set to value "finance", key "problem" to value "portfolio_optimization", key "algorithm" to value "vqe", key "optimizer" to value "cobyla", etc. Such data is collected at the user-interface level after the user completes the selections representing the quantum-problem execution, and transmitted to the server. In another embodiment, where the user interface is programmatic (for example, a Jupyter Notebook interface), the actual code of the experiment (as opposed to a dictionary) may be transmitted to the server. It should be noted that such a programmatic interface is also a zero-footprint interface in that it does not require the user to install any code or library beforehand.

In one embodiment the user's selections may also be checked for consistency to make sure that the selections are appropriate.

In one embodiment, the user may provide problem data for the problem which is to be executed by the quantum backend.

In step 225, the server may instantiate a quantum program for execution and may communicate the quantum program to the selected backend. In one embodiment, an algorithm, or combination of algorithms, may generate one or more circuits via calls to a circuits library.

In step 230, the selected quantum backend may execute the quantum program using the program data, and in step 235, the results of the execution are returned to the user interface.

Hereinafter, general aspects of implementation of the systems and methods of the embodiments will be described.

The system of the embodiments or portions of the system of the embodiments may be in the form of a "processing machine," such as a general-purpose computer, for example. As used herein, the term "processing machine" is to be understood to include at least one processor that uses at least one memory. The at least one memory stores a set of instructions. The instructions may be either permanently or temporarily stored in the memory or memories of the processing machine. The processor executes the instructions that are stored in the memory or memories in order to process data. The set of instructions may include various instructions that perform a particular task or tasks, such as those tasks described above. Such a set of instructions for performing a particular task may be characterized as a program, software program, or simply software.

In one embodiment, the processing machine may be a specialized processor.

As noted above, the processing machine executes the instructions that are stored in the memory or memories to process data. This processing of data may be in response to commands by a user or users of the processing machine, in response to previous processing, in response to a request by another processing machine and/or any other input, for example.

As noted above, the processing machine used to implement the embodiments may be a general-purpose computer. However, the processing machine described above may also utilize any of a wide variety of other technologies including a special purpose computer, a computer system including, for example, a microcomputer, mini-computer or mainframe, a programmed microprocessor, a micro-controller, a peripheral integrated circuit element, a CSIC (Customer Specific Integrated Circuit) or ASIC (Application Specific Integrated Circuit) or other integrated circuit, a logic circuit, a digital signal processor, a programmable logic device such as a FPGA, PLD, PLA or PAL, or any other device or arrangement of devices that is capable of implementing the steps of the processes of the embodiments.

The processing machine used to implement the embodiments may utilize a suitable operating system. Thus, embodiments may include a processing machine running the iOS operating system, the OS X operating system, the Android operating system, the Microsoft Windows™ operating systems, the Unix operating system, the Linux operating system, the Xenix operating system, the IBM AIX™ operating system, the Hewlett-Packard UX™ operating system, the Novell Netware™ operating system, the Sun Microsystems Solaris™ operating system, the OS/2™ operating system, the BeOS™ operating system, the Macintosh operating system, the Apache operating system, an OpenStep™ operating system or another operating system or platform.

It is appreciated that in order to practice the methods as described above, it is not necessary that the processors and/or the memories of the processing machine be physically located in the same geographical place. That is, each of the processors and the memories used by the processing machine may be located in geographically distinct locations and connected so as to communicate in any suitable manner. Additionally, it is appreciated that each of the processor and/or the memory may be composed of different physical pieces of equipment. Accordingly, it is not necessary that the processor be one single piece of equipment in one location and that the memory be another single piece of equipment in another location. That is, it is contemplated that the processor may be two pieces of equipment in two different physical locations. The two distinct pieces of equipment may be connected in any suitable manner. Additionally, the memory may include two or more portions of memory in two or more physical locations.

To explain further, processing, as described above, is performed by various components and various memories. However, it is appreciated that the processing performed by two distinct components as described above may, in accordance with a further embodiment, be performed by a single component. Further, the processing performed by one distinct component as described above may be performed by two distinct components. In a similar manner, the memory storage performed by two distinct memory portions as described above may, in accordance with a further embodiment, be performed by a single memory portion. Further, the memory storage performed by one distinct memory portion as described above may be performed by two memory portions.

Further, various technologies may be used to provide communication between the various processors and/or memories, as well as to allow the processors and/or the memories to communicate with any other entity; i.e., so as to obtain further instructions or to access and use remote memory stores, for example. Such technologies used to provide such communication might include a network, the Internet, Intranet, Extranet, LAN, an Ethernet, wireless communication via cell tower or satellite, or any client server system that provides communication, for example. Such communications technologies may use any suitable protocol such as TCP/IP, UDP, or OSI, for example.

As described above, a set of instructions may be used in the processing of the embodiments. The set of instructions may be in the form of a program or software. The software may be in the form of system software or application software, for example. The software might also be in the form of a collection of separate programs, a program module within a larger program, or a portion of a program module, for example. The software used might also include modular programming in the form of object oriented programming. The software tells the processing machine what to do with the data being processed.

Further, it is appreciated that the instructions or set of instructions used in the implementation and operation of the embodiments may be in a suitable form such that the processing machine may read the instructions. For example, the instructions that form a program may be in the form of a suitable programming language, which is converted to machine language or object code to allow the processor or processors to read the instructions. That is, written lines of programming code or source code, in a particular programming language, are converted to machine language using a compiler, assembler or interpreter. The machine language is binary coded machine instructions that are specific to a particular type of processing machine, i.e., to a particular type of computer, for example. The computer understands the machine language.

Any suitable programming language may be used in accordance with the various embodiments. Illustratively, the programming language used may include assembly language, Ada, APL, Basic, C, C++, COBOL, dBase, Forth, Fortran, Java, Modula-2, Pascal, Prolog, Python, REXX, Visual Basic, and/or JavaScript, for example. Further, it is not necessary that a single type of instruction or single programming language be utilized in conjunction with the operation of the system and method of the embodiments. Rather, any number of different programming languages may be utilized as is necessary and/or desirable.

Also, the instructions and/or data used in the practice of the embodiments may utilize any compression or encryption technique or algorithm, as may be desired. An encryption module might be used to encrypt data. Further, files or other data may be decrypted using a suitable decryption module, for example.

As described above, the embodiments may illustratively be embodied in the form of a processing machine, including a computer or computer system, for example, that includes at least one memory. It is to be appreciated that the set of instructions, i.e., the software, for example, that enables the computer operating system to perform the operations described above may be contained on any of a wide variety of media or medium, as desired. Further, the data that is processed by the set of instructions might also be contained on any of a wide variety of media or medium. That is, the particular medium, i.e., the memory in the processing machine, utilized to hold the set of instructions and/or the data used in the embodiments may take on any of a variety of physical forms or transmissions, for example. Illustratively, the medium may be in the form of paper, paper transparencies, a compact disk, a DVD, an integrated circuit, a hard disk, a floppy disk, an optical disk, a magnetic tape, a RAM, a ROM, a PROM, an EPROM, a wire, a cable, a fiber, a communications channel, a satellite transmission, a memory card, a SIM card, or other remote transmission, as well as any other medium or source of data that may be read by the processors of the embodiments.

Further, the memory or memories used in the processing machine that implements the embodiments may be in any of a wide variety of forms to allow the memory to hold instructions, data, or other information, as is desired. Thus, the memory might be in the form of a database to hold data. The database might use any desired arrangement of files such as a flat file arrangement or a relational database arrangement, for example.

In the system and method of the embodiments, a variety of "user interfaces" may be utilized to allow a user to interface with the processing machine or machines that are used to implement the embodiments. As used herein, a user interface includes any hardware, software, or combination of hardware and software used by the processing machine that allows a user to interact with the processing machine. A user interface may be in the form of a dialogue screen for example. A user interface may also include any of a mouse, touch screen, keyboard, keypad, voice reader, voice recognizer, dialogue screen, menu box, list, checkbox, toggle switch, a pushbutton or any other device that allows a user to receive information regarding the operation of the processing machine as it processes a set of instructions and/or provides the processing machine with information. Accordingly, the user interface is any device that provides communication between a user and a processing machine. The information provided by the user to the processing machine through the user interface may be in the form of a command, a selection of data, or some other input, for example.

As discussed above, a user interface is utilized by the processing machine that performs a set of instructions such that the processing machine processes data for a user. The user interface is typically used by the processing machine for interacting with a user either to convey information or receive information from the user. However, it should be appreciated that in accordance with some embodiments, it is not necessary that a human user actually interact with a user interface used by the processing machine. Rather, it is also contemplated that the user interface might interact, i.e., convey and receive information, with another processing machine, rather than a human user. Accordingly, the other processing machine might be characterized as a user. Further, it is contemplated that a user interface utilized in the system and method of the embodiments may interact partially with another processing machine or processing machines, while also interacting partially with a human user.

It will be readily understood by those persons skilled in the art that the present embodiments are susceptible to broad utility and application. Many embodiments and adaptations other than those herein described, as well as many variations, modifications and equivalent arrangements, will be apparent from or reasonably suggested by the present embodiments and foregoing description thereof, without departing from the substance or scope of the invention.

Accordingly, while the present exemplary embodiments have been described here in detail, it is to be understood that this disclosure is only illustrative and exemplary and is made to provide an enabling disclosure of the invention. Accordingly, the foregoing disclosure is not intended to be construed or to limit the present embodiments or otherwise to exclude any other such embodiments, adaptations, variations, modifications or equivalent arrangements.

What is claimed is:

1. A method for cloud-based execution of quantum-computing programs, comprising:
   in an electronic device comprising at least one computer processor:
      receiving, from a user interface on a client device, a serialized file comprising a user selection of a problem domain from a plurality of problem domains, an application for the problem domain from a plurality of applications, and quantum algorithm from a plurality of quantum algorithms, wherein the problem domain, the application for the problem domain, and the quantum algorithm are selected from a problem domain library, an application library, and a quantum algorithm library;
      verifying that the user selection of the problem domain, the application for the problem domain, and the quantum algorithm are consistent with each other;
      receiving, from the user interface, problem data and an identification of a quantum computing backend for executing the problem data;
      instantiating a quantum program for execution using the user selection of the problem domain, the application for the problem domain, and the quantum algorithm, and communicating the quantum program and the problem data to the quantum computing backend for execution;
      receiving, from the quantum computing backend, an output of the execution; and
      communicating the output to the user interface on the client device.

2. The method of claim 1, wherein the problem domain, the application, and the quantum algorithm are selected serially.

3. The method of claim 1, wherein the serialized file has a standardized format.

4. The method of claim 1, wherein the problem domain, the application, and the quantum algorithm are represented in the serialized file as key/value pairs.

5. The method of claim 1, wherein the quantum computing backend comprises a quantum computer.

6. The method of claim 1, wherein the quantum computing backend comprises a quantum computing simulator.

7. A method for cloud-based execution of quantum-computing programs, comprising:
   in an electronic device comprising at least one computer processor:
      receiving, from a user interface on a client device, a user selection of a problem domain from a plurality of problem domains, an application for the problem domain from a plurality of applications, and quantum algorithm from a plurality of quantum algorithms, wherein the problem domain, the application for the problem domain, and the quantum algorithm are selected from a problem domain library, an application library, and a quantum algorithm library;
      receiving, from the user interface, problem data and an identification of a quantum computing backend for executing the problem data;
      serializing the user selection of the problem domain, the application, and the quantum algorithm into a serialized file;
      communicating the serialized file and the problem data to a server, wherein the server verifies that the user selection of the problem domain, the application for the problem domain, and the quantum algorithm are consistent with each other and instantiates a quantum program for execution using the user selection of the problem domain, the application for the problem domain, and the quantum algorithm, and communicates the quantum program and the problem data to the quantum computing backend for execution;
      receiving, from the quantum computing backend via the server, an output of the execution; and
      presenting the output to the user interface on the client device.

8. The method of claim 7, wherein the problem domain, the application, and the quantum algorithm are selected serially.

9. The method of claim 7, wherein the serialized file has a standardized format.

10. The method of claim 7, wherein the problem domain, the application, and the quantum algorithm are represented in the serialized file as key/value pairs.

11. The method of claim 7, wherein the quantum computing backend comprises a quantum computer.

12. The method of claim 7, wherein the quantum computing backend comprises a quantum computing simulator.

13. A system for cloud-based execution of quantum-computing programs, comprising:

a client device comprising a client device computer processor and executing a user interface;

a server comprising a server computer processor in communication with the client device;

a problem domain library comprising a plurality of problem domains;

an application library comprising a plurality of applications for each of the plurality of problem domains;

a quantum algorithm library comprising a plurality of quantum algorithms for each of the plurality of applications;

a circuit library comprising a plurality of quantum circuits; and a plurality of quantum computing backends;

wherein:

the client device receives, at the user interface, a user selection of one of the plurality of problem domains from the problem domain library, one of the plurality of applications from the application library, and one of the plurality of quantum algorithms from the quantum algorithm library;

the client device receives, at the user interface, problem data and an identification of one of the plurality of quantum computing backends for executing the problem data;

the client device serializes the selection of the problem domain, the application, and the quantum algorithm into a serialized file;

the client device communicates the serialized file and the problem data to a server, wherein the server instantiates a quantum program and communicates the quantum program and the problem data to the identified quantum computing backend for execution, wherein the quantum program comprises at least one circuit from the circuit library;

the server verifies that the user selection of the problem domain, the application, and the quantum algorithm are consistent with each other;

the server instantiates a quantum program for execution using the user selection of the problem domain, the application, and the quantum algorithm, and communicates the quantum program and the problem data to the identified quantum computing backend for execution; and the server receives, from the identified quantum computing backend, an output of the execution and communicates the output to the user interface on the client device.

14. The system of claim 13, wherein the problem domain, the application, and the quantum algorithm are selected serially.

15. The system of claim 13, wherein the problem domain, the application, and the quantum algorithm are represented in the serialized file as key/value pairs.

16. The system of claim 13, wherein the plurality of quantum computing backends comprise a quantum computer and a quantum computing simulator.

* * * * *